US007986792B2

(12) United States Patent
Noro

(10) Patent No.: US 7,986,792 B2
(45) Date of Patent: Jul. 26, 2011

(54) ADAPTER CONNECTABLE BETWEEN AUDIO AMPLIFIER AND TRANSMITTER FOR CORDLESS SPEAKER

(75) Inventor: Masao Noro, Hamamatsu (JP)

(73) Assignee: Yamaha Corporation (JP)

( * ) Notice: Subject to any disclaimer, the term of this patent is extended or adjusted under 35 U.S.C. 154(b) by 1407 days.

(21) Appl. No.: 11/138,559

(22) Filed: May 26, 2005

(65) Prior Publication Data

US 2005/0265564 A1 Dec. 1, 2005

(30) Foreign Application Priority Data

May 27, 2004 (JP) ................................ 2004-157746

(51) Int. Cl.
*H04B 3/00* (2006.01)
*H03G 5/00* (2006.01)

(52) U.S. Cl. .............................. 381/80; 381/98; 381/99

(58) Field of Classification Search .............. 381/17–19, 381/79, 98–99, 300, 307, 74, 303, 309–310, 381/80

See application file for complete search history.

(56) References Cited

U.S. PATENT DOCUMENTS

| | | | | |
|---|---|---|---|---|
| 5,197,099 | A * | 3/1993 | Hirasawa | 381/27 |
| 6,614,912 | B1 * | 9/2003 | Yamada et al. | 381/310 |
| 6,956,954 | B1 * | 10/2005 | Takemura et al. | 381/307 |
| 7,391,869 | B2 * | 6/2008 | Eid et al. | 381/22 |
| 2003/0215104 | A1 * | 11/2003 | Yamada et al. | 381/309 |

FOREIGN PATENT DOCUMENTS

| | | | |
|---|---|---|---|
| JP | 4-371100 | A | 12/1992 |
| JP | 6-225398 | A | 8/1994 |
| JP | 3072057 | U | 7/2000 |
| JP | 2002-171599 | A | 6/2002 |
| JP | 2003-274499 | A | 9/2003 |
| WO | 02/19767 | A2 | 3/2002 |

OTHER PUBLICATIONS

Notification of Reasons for Rejection issued corresponding to Japanese application No. 2004-157746, mailed Nov. 4, 2008.

* cited by examiner

*Primary Examiner* — Devona E Faulk
*Assistant Examiner* — George Monikang
(74) *Attorney, Agent, or Firm* — Rossi, Kimms & McDowell LLP

(57) ABSTRACT

An adaptor is connectable between a signal processor and a transmission module. The signal processor has three audio channels for feeding respectively a first audio signal, a second audio signal, and a third audio signal having a frequency range lower than a frequency range of the first and second audio signals. The transmission module has two transmission channels capable of transmitting two audio signals to a codeless speaker. The adaptor has three input terminals for receiving the first, second and third audio signals from the signal processor. The adaptor filters at least one of the first and second audio signals for cutting therefrom a lower frequency range comparative to the lower frequency range of the third audio signal, and adds the third audio signal to the one of the first and second audio signals from which the lower frequency range is cut. The adaptor has two output terminals, one of which feeds the one of the first and second audio signals added with the third audio signal to one of the two transmission channels of the transmission module, and the other of which feeds the other of the first and second audio signals to the other of the two transmission channels of the transmission module.

6 Claims, 4 Drawing Sheets

ADAPTER CONNECTABLE BETWEEN AUDIO AMPLIFIER AND TRANSMITTER FOR CORDLESS SPEAKER

BACKGROUND OF THE INVENTION

1. Technical Field

The present invention relates to a system for cordlessly connecting an audio amplifier with a speaker using the radio, for example.

2. Related Art

Presently, there are commercialized multi-channel audio systems such as 5.1-channel surround systems. A multi-channel audio system makes it necessary to install speakers at four corner in a room so as to surround a listener. It is cumbersome to connect cables to the speakers from an audio amplifier. In addition, such cabling degrades the visual esthetic.

To solve this problem, there are proposed cordless speaker systems that cordlessly transmit audio signals as disclosed in Japanese Non-examined Patent Publication No. 2003-274499. The disclosed apparatus can control the speaker volume at the receiving side by superposing character multiplex data on an FM stereo signal.

However, the conventional apparatus uses an analog multiplexer to multiplex FM stereo signals. The configuration may become complex and costly. Presently, economically available transmission modules are limited to a type of two channels (or one channel). When an attempt is made to transmit and receive audio signals for three or more channels using one radio frequency, a special circuit configuration needs to be originally designed as mentioned above. There has been a problem of consuming a lot of time and costs.

Further, a front speaker and a center speaker are generally installed near the audio amplifier. Cable connection to an AV amplifier does not cause much trouble in cabling. It is expected to wirelessly transmit audio signals only to surround speakers and subwoofers.

SUMMARY OF THE INVENTION

It is an object of the present invention to provide an adapter and a transmitter for cordless speakers, and an audio amplifier capable of 3-channel transmission for three audio channels including an additional subwoofer channel using a general-purpose economical 2-channel transmission module.

In one aspect of the invention, there is provided an adaptor connectable between a signal processor and a transmission module, the signal processor having three audio channels for feeding respectively a first audio signal, a second audio signal, and a third audio signal having a frequency range lower than a frequency range of the first and second audio signals, the transmission module having two transmission channels capable of transmitting two audio signals to a codeless speaker. The inventive adaptor comprises three input terminals that correspond to the three audio channels of the signal processor for receiving therefrom the first, second and third audio signals, a filter section that filters at least one of the first and second audio signals for cutting therefrom a lower frequency range comparative to the lower frequency range of the third audio signal, an addition section that adds the third audio signal to said one of the first and second audio signals from which the lower frequency range is cut, and two output terminals that correspond to the two transmission channels of the transmission module, so that one of the two output terminals feeds said one of the first and second audio signals added with the third audio signal to one of the two transmission channels of the transmission module, and the other of the two output terminals feeds the other of the first and second audio signals to the other of the two transmission channels of the transmission module.

In another aspect of the invention, there is provided a transmission apparatus having two transmission channels for wirelessly transmitting audio signals fed from a signal processor apparatus having three audio channels to a wireless speaker. The inventive transmission apparatus comprises three input terminals that correspond to the three audio channels of the signal processor apparatus for receiving therefrom a first audio signal, a second audio signal, and a third audio signal having a frequency range lower than a frequency range of the first and second audio signals, a filter section that filters at least one of the first and second audio signals for cutting therefrom a lower frequency range comparative to the lower frequency range of the third audio signal, an addition section that adds the third audio signal to said one of the first and second audio signals from which the lower frequency range is cut, and a transmission module that transmits said one of the first and second audio signals added with the third audio signal through one of the two transmission channels, and transmits the other of the first and second audio signals through the other of the two transmission channels.

In a further aspect of the invention, there is provided an audio amplifier apparatus having at least three audio channels for processing audio channels and having two transmission channels for wirelessly transmitting the audio signals to a wireless speaker. The inventive audio amplifier apparatus comprises an signal processor that processes audio signals through the three audio channels to feed a first audio signal, a second audio signal, and a third audio signal having a frequency range lower than a frequency range of the first and second audio signals, a filter section that filters at least one of the first and second audio signals for cutting therefrom a lower frequency range comparative to the lower frequency range of the third audio signal, an addition section that adds the third audio signal to said one of the first and second audio signals from which the lower frequency range is cut, and a transmission module that transmits said one of the first and second audio signals added with the third audio signal through one of the two transmission channels, and transmits the other of the first and second audio signals through the other of the two transmission channels.

Preferably, the inventive audio amplifier apparatus further comprises three output terminals that are provided for outputting the first audio signal, the second audio signal, and the third audio signal, respectively, to an external audio apparatus, and a changeover section that distributes the first, second and third audio signals fed from the signal processor selectively to either of the three output terminals or the two transmission channels through the filter section and the addition section.

Preferably in the inventive audio amplifier apparatus, the signal processor processes the audio signals through the three audio channels which constitute a pair of rear or surround left and right channels and a subwoofer channel, and feeds the first audio signal and the second audio signal through the pair of the rear or surround left and right channels and feeds the third audio signal through the subwoofer channel.

The present invention is based on the following concept. In a general multi-channel audio amplifier-speaker system, bass sound is mostly generated by a subwoofer speaker. In addition, a surround (rear) speaker has a small size due to its small diameter and shows substantially no influence for the bass sound. The present invention synthesizes the third audio signal of the subwoofer channel into the lower frequency range of the first and second audio signals of the left and right channels (especially surround channels). In this manner, the present invention transmits three channels of the audio signals including the bass channel (subwoofer channel) using a 2-channel transmission module.

The audio signal of the bass channel may be integrated into one of the two surround channels. Further, it may be mixed into both of the two channels so as to balance the left and right channels and improve the bass channel's S/N ratio.

As mentioned above, the present invention transmits a bass channel's audio signal by synthesizing it into either or both of two left and right channels that hardly reproduce the bass range. Consequently, it is possible to equivalently increase the number of transmission channels for wireless transmission without increasing the number of actual transmission channels.

DETAILED DESCRIPTION OF THE INVENTION

Embodiments of the present invention will be described in further detail with reference to the accompanying drawings.

Figure 1:
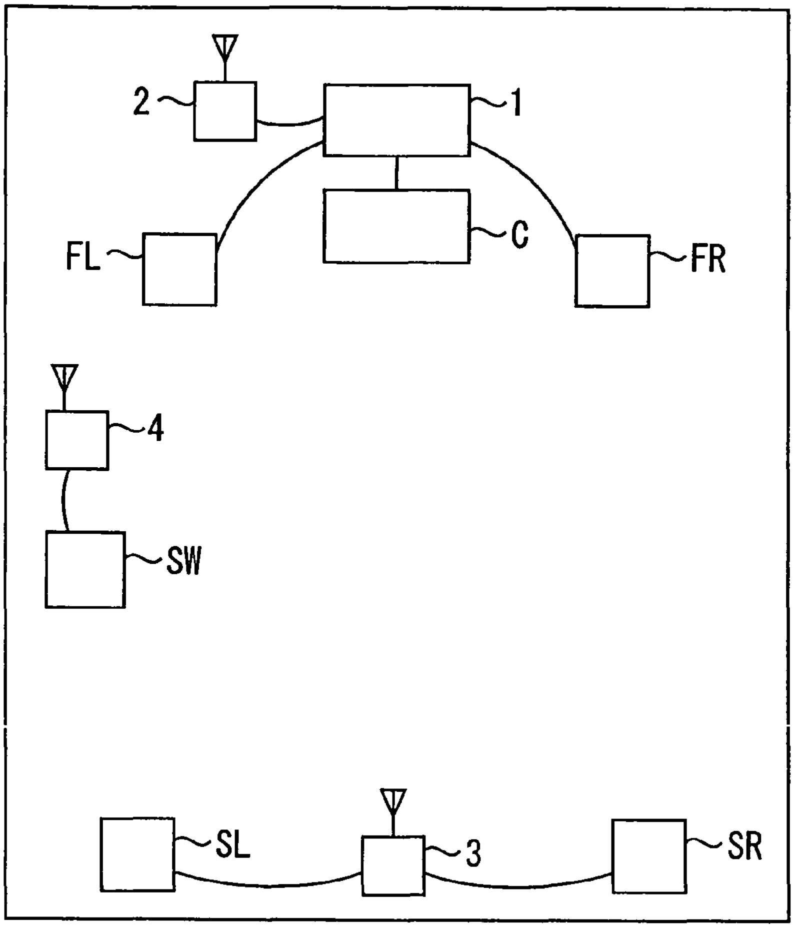
FIG. 1 is a diagram showing the layout of a listening room for installing a surround audio system according to the present invention.

FIG. 1 shows the layout of a listening room for installing a surround audio system according to an embodiment of the present invention. An AV amplifier 1 and a center speaker C for reproducing 5.1-channel surround audio are installed at the front center of the listening room. The AV amplifier 1 contains a signal processor for processing audio signals and feeds the processed audio signals as 5.1-channel surround audio signals. To the left and the right thereof, left and right front speakers FL and FR are installed. Left and right surround speakers SL and SR are installed near a rear wall of the listening room. A subwoofer speaker SW is installed near a left wall of the listening room relative to a front wall. The left and right front speakers SL and SR and the center speaker C are connected to the AV amplifier 1 by means of cables. The left and right surround speakers SL and SR and the subwoofer speaker SW are wirelessly connected to the AV amplifier 1. The surround speakers SL and SR and the subwoofer speaker SW are active speakers containing power amplifiers.

The AV amplifier 1 connects with a transmitter 2 that transmits FM stereo signals at an 800 MHz band. The surround speakers SL and SR connect with a common receiver 3. The receiver 3 receives the FM stereo signal transmitted from the transmitter 2, separates the received signal into two channels (left and right channels), and supplies them to the surround speakers SL and SR, respectively. The subwoofer speaker SW connects with another receiver 4. Like the receiver 3, the receiver 4 also receives the FM stereo signal transmitted from the transmitter 2. The receiver 4 supplies the subwoofer speaker SW with only a low range (150 Hz or lower) of the received audio signal.

Figure 2:
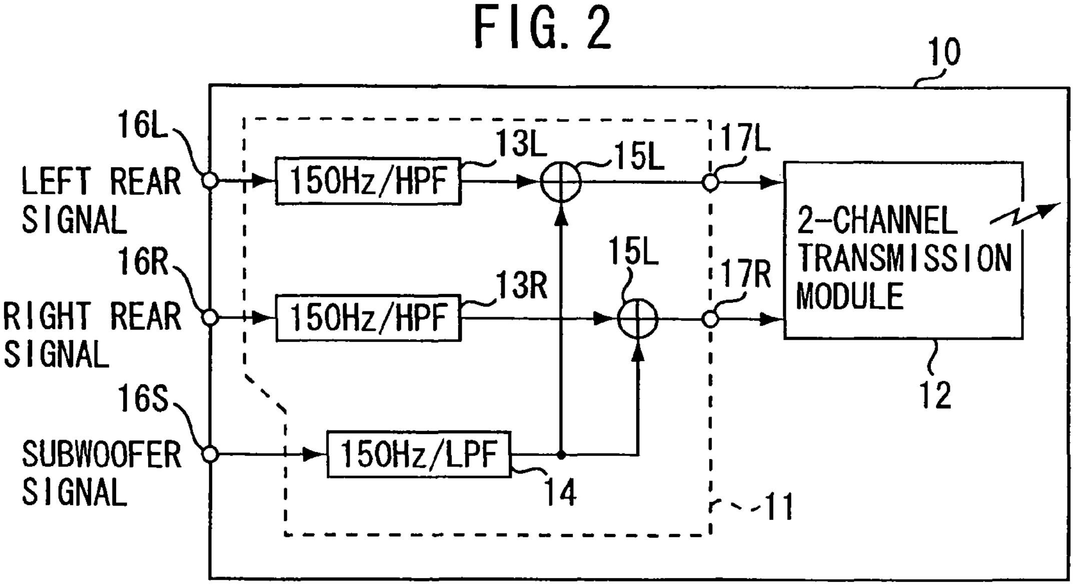
FIG. 2 is a block diagram of a transmitter as an embodiment of the present invention.
Figure 3A:
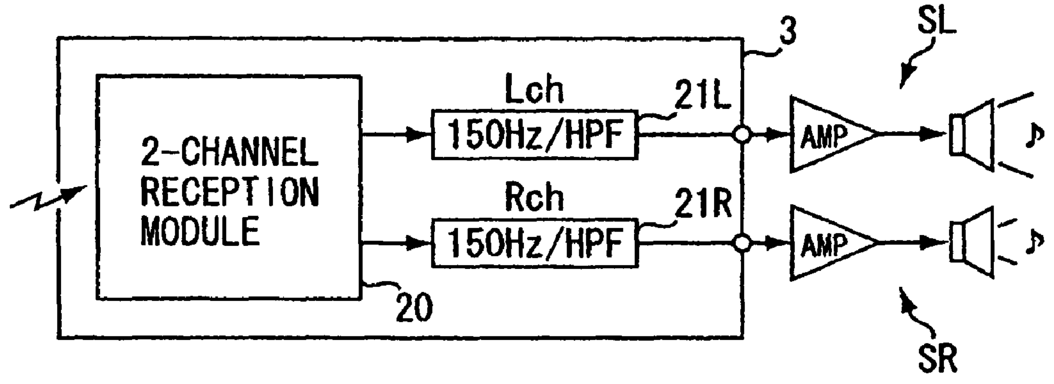
FIGS. 3(A) and 3(B) are block diagrams showing receivers connected to surround speakers and a subwoofer.
Figure 3B:
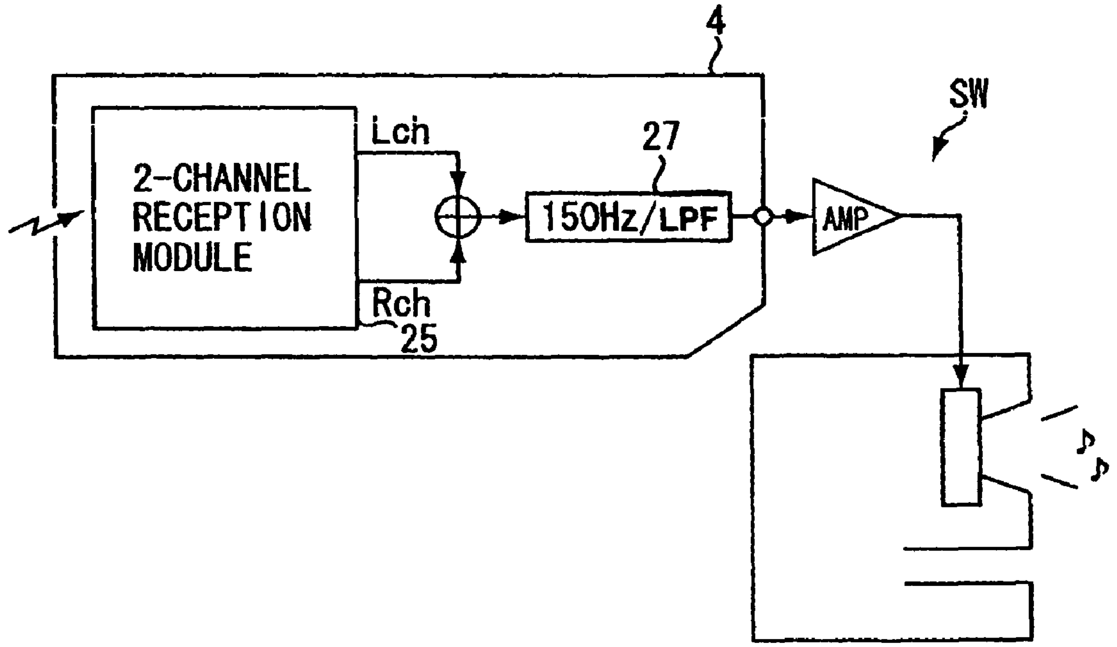

FIG. 2 is a block diagram of the transmitter 2. FIGS. 3(A) and 3(B) are block diagrams of the receivers 3 and 4.

In FIG. 2, the transmitter 2 is composed of a signal synthesis circuit 11 and a 2-channel transmission module 12. The signal synthesis circuit 11 synthesizes or mixes subwoofer signal into the surround signal. The signal synthesis circuit 11 has input terminals 16L, 16R, and 16S that are connected to audio output terminals SL (surround (rear) left channel), SR (surround (rear) right channel), and SW (subwoofer channel) of the AV amplifier 1. The input terminals 16L and 16R are respectively connected to output terminals 17L and 17R through highpass filters 13L and 13R to pass only signals at 150 Hz or higher via and adder circuits 15L and 15R. The input terminal 16S is connected to the adder circuits 15L and 15R via a lowpass filter 14 to pass only signals at 150 Hz or lower.

This connection replaces a low frequency range of the left and right channel signals than or equal to 150 Hz with the subwoofer signal, which are then transmitted as 2-channel signals.

The transmitter 2 may be configured as a transmission apparatus 10, i.e., an integration of the signal synthesis circuit 11 and the transmission module 12. otherwise, the signal synthesis circuit 11 and the transmission module 12 may be provided as independent apparatuses. In this case, the signal synthesis circuit 11 functions as a cordless speaker adapter for transmitting 3-channel signals as 2-channel signals.

In FIG. 3(A), the receiver 3 includes a 2-channel reception module 20 and highpass filters 21L and 21R. The highpass filters 21L and 21R cut a part of 2-channel (L/R) signals lower than 150 Hz output from the reception module 20, and allow to pass only signals at frequencies higher than or equal to 150 Hz. Signals at 150 Hz or higher frequencies filtered by the highpass filters are supplied to the surround speakers SL and SR for the left and right channels and are amplified by the amplifiers in the speakers for sound generation.

In FIG. 3(B), the receiver 4 includes a 2-channel reception module 25, an adder circuit 26, and a lowpass filter 27. The adder circuit 26 adds 2-channel (L/R) signals output from the reception module 20. The lowpass filter 27 cuts a part of the added signals exceeding 150 Hz, and allows to pass only signals at frequencies lower than or equal to 150 Hz. Signals at frequencies lower than or equal to 150 Hz filtered by the lowpass filter 27 are input to the subwoofer channel speaker SW and are amplified by the amplifier in the speaker.

Generally, typical surround speakers (rear speakers) are smaller than front-channel speakers in terms of diameters, and inherently provide little gain for low-range (e.g., 150 Hz or lower) signals. Accordingly, the highpass filters 21L and 21R of the receiver 3 may be omissible.

Generally, the AV amplifier previously filters the audio signal to cut the mid to high range (e.g., 150 Hz or higher) for the subwoofer channel. Accordingly, the lowpass filter 14 of the transmitter 2 may be omissible.

Figure 4:
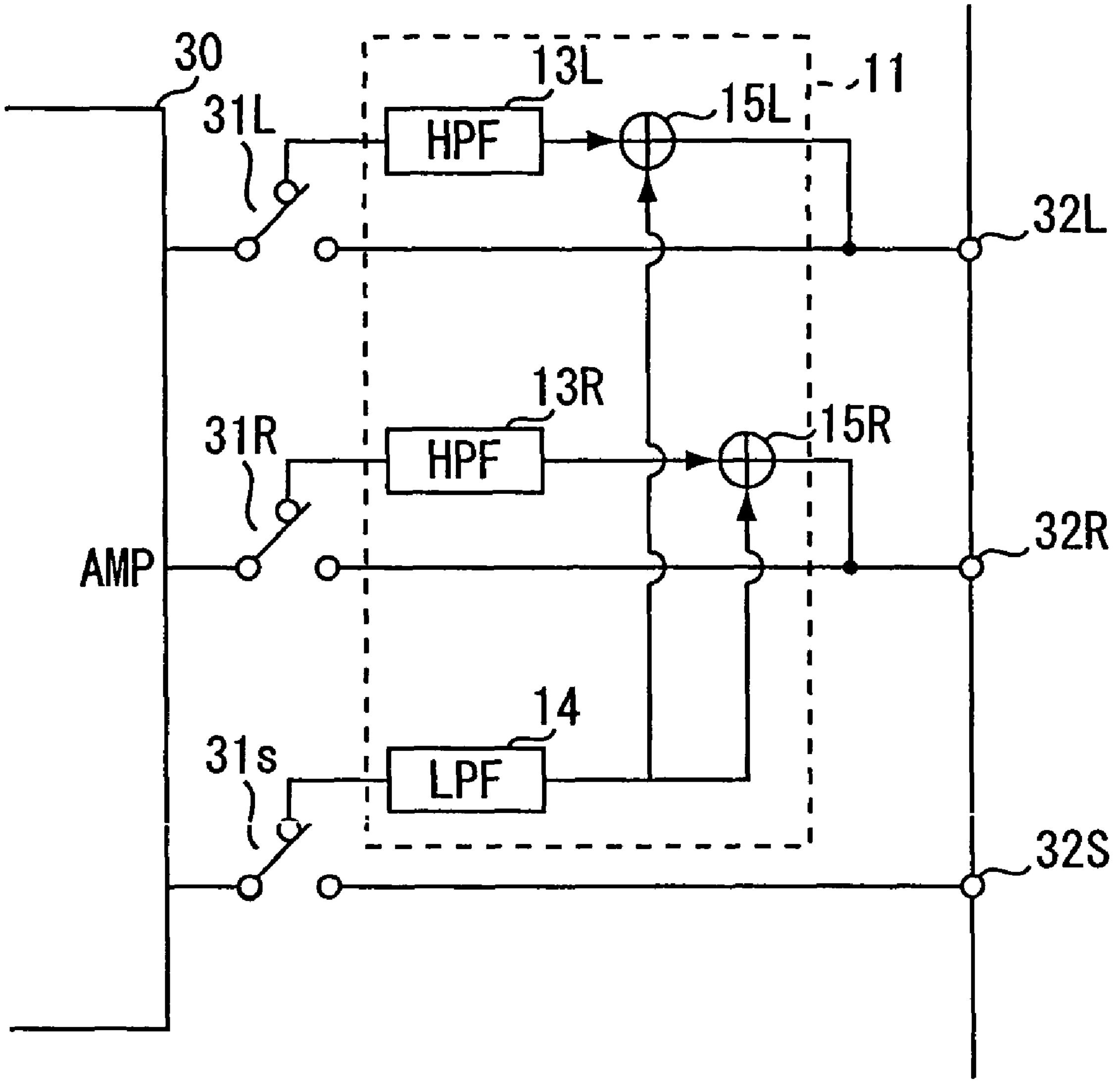
FIG. 4 is a block diagram showing an AV amplifier as an embodiment of the present invention.

FIG. 4 shows an embodiment which integrates the signal synthesis circuit 11 in the AV amplifier 1. The embodiment can select whether to externally output the subwoofer channel signal directly or to mix the subwoofer channel signal with the left and right surround channels.

A signal processor of an amplifier 30 outputs 5.1-channel audio signals that include those for the left and right surround channels SL and SR and the subwoofer channel SW. These signals are input to changeover switches 31L, 31R, and 31S. These switches interlock as one changeover switch 31. The changeover switch 31 selects whether to supply the audio signals SL, SR, and SW directly the audio output terminals 32L, 32R, and 32S or to the signal synthesis circuit 11. Audio signals for the front channels FL and FR and the center channel C are directly supplied to other audio output terminals (not shown).

As shown in FIG. 4, the signal synthesis circuit 11 includes the highpass filters 13L and 13R, the lowpass filter 14, and the adder circuits 15L and 15R. The signal synthesis circuit 11 integrates the audio signal for the subwoofer channel into a low range of the audio signals for the left and right surround channels. Let us consider that the 2-channel transmission module 12 (not shown) is connected to the audio signal output terminals 32L and 32R and that the changeover switch 31 is set to the signal synthesis circuit 11. In this case, the transmission module 12 can be used to wirelessly and concurrently transmit three channel signals for the left and right surround channels SL and SR and the subwoofer channel SW.

When the surround speakers and the subwoofer are connected through cables in this configuration, the changeover switch 31 is set to the audio output terminals 32L, 32R, and 32S, which are connected with the speakers' cables.

Figure 5:
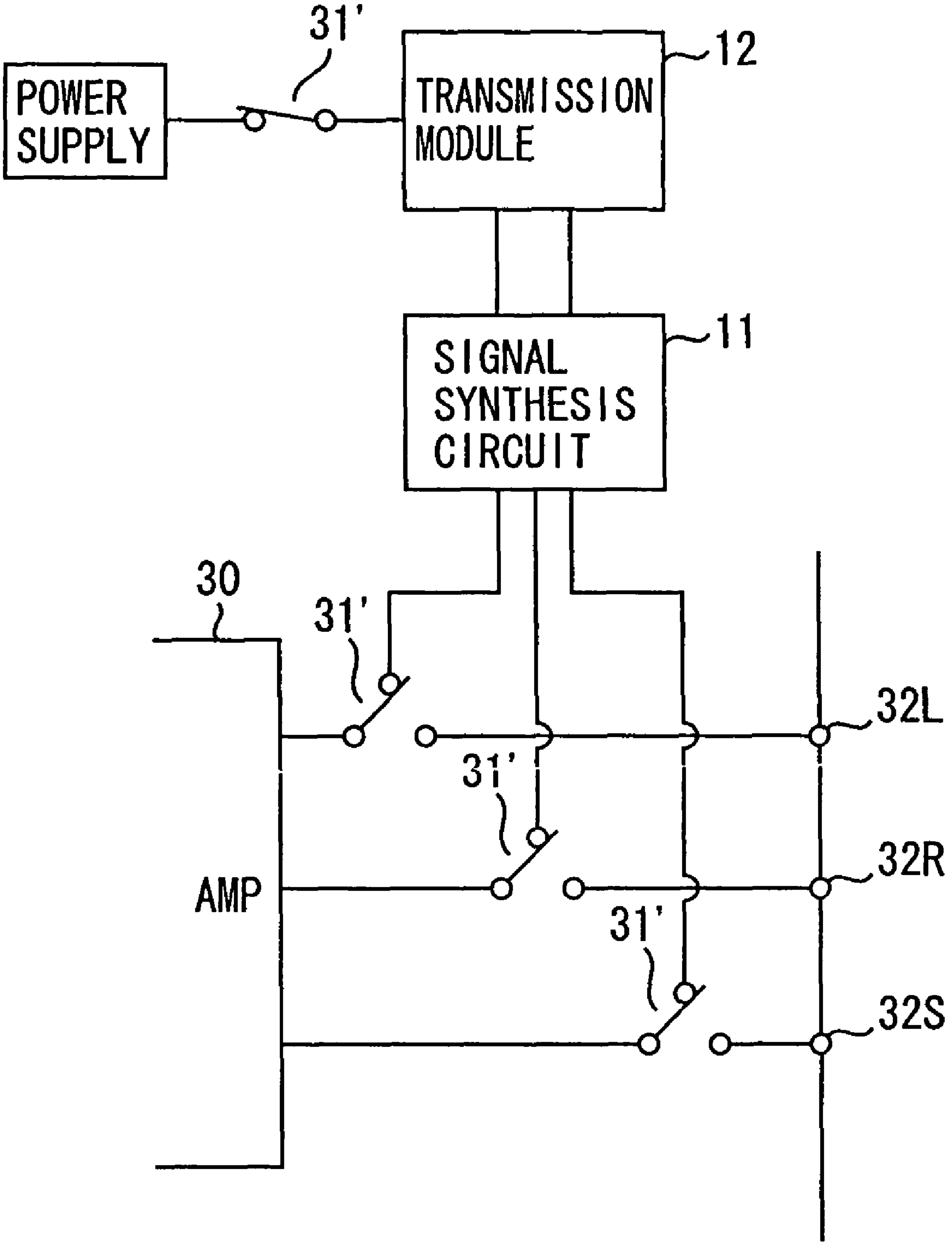
FIG. 5 is a block diagram showing an AV amplifier as another embodiment of the present invention.

FIG. 5 shows another embodiment of installing also a transmission module 12 in the AV amplifier 1 in addition to the signal synthesis circuit 11. That is, the configuration simply integrates the transmitter 2 of FIG. 1 in the AV amplifier 1. The changeover switch 31' selects whether to supply the audio signals for the left and right surround channels SL and SR and the subwoofer channel SW to audio output terminals 32L, 32R, and 32S or to the signal synthesis circuit 11. In addition, the changeover switch 31' turns on or off the transmission module 12. That is, the changeover switch 31' turns on the transmission module 12 when switching the audio signals to the signal synthesis circuit 11. The changeover switch 31' turns off the transmission module 12 when switching the audio signals to the audio output terminals 32. When the changeover switch 31' is set to the signal synthesis circuit 11, no audio signals are output to the audio signal terminals 32L, 32R, and 32S.

The embodiments shown in FIGS. 4 and 5 use an analog circuit for the signal synthesis circuit 11. It may be preferable to use a DSP to digitally implement the signal synthesis circuit.

The above-mentioned embodiments transmit signals by replacing a lower frequency range of the left and right surround channels with the signal of the subwoofer channel. It may be possible to transmit signals by combining signals of other channels with the signal of the subwoofer channel. The other channels include the left and right front channels, and the left front channel and the left rear channel, for example. These channels may be determined depending on installation positions of the AV amplifier and the speakers. If the front channel uses a small speaker, cutting the bass range gives little affect. This is because the bass sound is mostly generated by the subwoofer.

While the embodiments adopt the wireless transmission in terms of the FM stereo using the UHF band (800 MHz band), the present invention is not limited thereto. For example, it may be possible to adopt the digital transmission or the infrared transmission. In any case, it just needs to use an economically available 2-channel stereo transmission module.

What is claimed is:

1. An adaptor connectable between a signal processor and a transmission module, the signal processor having three audio channels for feeding respectively a first audio signal, a second audio signal different from the first audio signal, and a third audio signal having a frequency range lower than a frequency range of the first and second audio signals, the transmission module having two transmission channels capable of transmitting two audio signals to a codeless speaker, the adaptor comprising:

three input terminals that correspond to the three audio channels of the signal processor for receiving therefrom the first audio signal, the second audio signal different from the first audio signal, and the third audio signal having the frequency range lower than the frequency range of the first and second audio signals;

a filter section that filters at least one of the first and second audio signals for cutting therefrom a lower frequency range comparative to the lower frequency range of the third audio signal;

an addition section that adds the third audio signal to said at least one of the first and second audio signals from which the lower frequency range is cut; and two output terminals that correspond to the two transmission channels of the transmission module, so that one of the two output terminals feeds one of the first and second audio signals added with the third audio signal to one of the two transmission channels of the transmission module, and the other of the two output terminals feeds the other of the first and second audio signals to the other of the two transmission channels of the transmission module.

2. A transmission apparatus having two transmission channels for wirelessly transmitting audio signals fed from a signal processor apparatus having three audio channels to a wireless speaker, the transmission apparatus comprising:

three input terminals that correspond to the three audio channels of the signal processor apparatus for receiving therefrom a first audio signal, a second audio signal different from the first audio signal, and a third audio signal having a frequency range lower than a frequency range of the first and second audio signals;

a filter section that filters at least one of the first and second audio signals for cutting therefrom a lower frequency range comparative to the lower frequency range of the third audio signal;

an addition section that adds the third audio signal to said at least one of the first and second audio signals from which the lower frequency range is cut; and a transmission module that transmits one of the first and second audio signals added with the third audio signal through one of the two transmission channels, and transmits the other of the first and second audio signals through the other of the two transmission channels.

3. An audio amplifier apparatus having at least three audio channels for processing audio signals and having two transmission channels for wirelessly transmitting the audio signals to a wireless speaker, the audio amplifier apparatus comprising:

an signal processor that processes audio signals through the three audio channels to feed a first audio signal, a second audio signal different from the first audio signal, and a third audio signal having a frequency range lower than a frequency range of the first and second audio signals;

a filter section that filters at least one of the first and second audio signals for cutting therefrom a lower frequency range comparative to the lower frequency range of the third audio signal, and that filters the third audio signal for cutting therefrom a higher frequency range comparative to a frequency range present in said at least one of the first and second audio signals from which the lower frequency range is cut;

an addition section that adds the third audio signal to said at least one of the first and second audio signals from which the lower frequency range is cut; and a transmission module that transmits one of the first and second audio signals added with the third audio signal through one of the two transmission channels, and transmits the other of the first and second audio signals through the other of the two transmission channels.

4. The audio amplifier apparatus according to claim 3, further comprising three output terminals that are provided for outputting the first audio signal, the second audio signal, and the third audio signal, respectively, to an external audio apparatus, and a changeover section that distributes the first, second and third audio signals fed from the signal processor selectively to either of the three output terminals or the two transmission channels through the filter section and the addition section.

5. The audio amplifier apparatus according to claim 3, wherein the signal processor processes the audio signals through the three audio channels which constitute a pair of rear or surround left and right channels and a subwoofer channel, and feeds the first audio signal and the second audio signal through the pair of the rear or surround left and right channels and feeds the third audio signal through the subwoofer channel.

6. A system comprising an audio amplifier apparatus having at least three audio channels for processing audio signals and having two transmission channels for wirelessly transmitting the audio signals; and one or more wireless speakers for wirelessly receiving the audio signals, wherein the audio amplifier apparatus comprises:

a signal processor that processes audio signals through the three audio channels to feed a first audio signal, a second audio signal, and a third audio signal having a frequency range lower than a frequency range of the first and second audio signals;

a filter section that filters at least one of the first and second audio signals for cutting therefrom a lower frequency range comparative to the lower frequency range of the third audio signal;

an addition section that adds the third audio signal to said at least one of the first and second audio signals from which the lower frequency range is cut; and a transmission module that transmits one of the first and second audio signals added with the third audio signal through one of the two transmission channels, and transmits the other of the first and second audio signals through the other of the two transmission channels, and wherein the one or more wireless speakers comprise a first wireless speaker, a second wireless speaker, or both the first wireless speaker and the second wireless speaker, the first wireless speaker comprising:

a reception module that wirelessly receives audio signals through the two transmission channels from the audio amplifier apparatus, the received audio signals containing the first audio signal, the second audio signal and the third audio signal;

a filter section that passes the first audio signal and the second audio signal contained in the received audio signals while cutting the third audio signal contained in the received audio signals; and a pair of amplifiers that receives the first audio signal and the second audio signal, respectively, from the filter section for generating sounds, the second wireless speaker comprising:

a reception module that wirelessly receives audio signals through the two transmission channels from the audio amplifier apparatus, the received audio signals containing the first audio signal, the second audio signal and the third audio signal;

a filter section that cuts the first audio signal and the second audio signal contained in the received audio signals while passing the third signal contained in the received audio signals; and an amplifier that receives the third audio signal from the filter section for generating sound.

* * * * *